(12) United States Patent
Callahan et al.

(10) Patent No.: US 6,531,974 B1
(45) Date of Patent: Mar. 11, 2003

(54) CONTROLLING TIME DELAY

(75) Inventors: Kent R. Callahan, Hillsboro, OR (US); Keng L. Wong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/545,235

(22) Filed: Apr. 7, 2000

(51) Int. Cl.[7] .................................................. H03M 1/66
(52) U.S. Cl. ...................................... 341/144; 341/120
(58) Field of Search ................................. 341/144, 118, 341/120; 327/158, 333, 263; 307/451

(56) References Cited

U.S. PATENT DOCUMENTS

| | | | | |
|---|---|---|---|---|
| 5,283,631 A | * | 2/1994 | Koerner et al. ............. 307/451 |
| 5,389,828 A | * | 2/1995 | Tago ........................... 327/263 |
| 5,680,075 A | * | 10/1997 | Sacca .......................... 330/279 |
| 5,900,754 A | * | 5/1999 | Nakatani ..................... 327/158 |
| 6,294,944 B1 | * | 9/2001 | Shiochi et al. .............. 327/333 |

* cited by examiner

*Primary Examiner*—Peguy JeanPierre
*Assistant Examiner*—Joseph J Lauture
(74) *Attorney, Agent, or Firm*—Fish & Richardson P.C.

(57) ABSTRACT

Controlling time delay includes using a delay line and a digital to analog converter configured to provide a signal to the delay line and including digital inputs configured to control the delay through the delay line by controlling amplifier gain elements included in the digital to analog converter.

23 Claims, 6 Drawing Sheets

Delay Stage symbol
And internal view

CONTROLLING TIME DELAY

BACKGROUND

This invention relates to controlling time delay.

Time delays (also called skew) occur, for example, in the propagation of clock signals to different parts of a synchronous computer system, impacting the ability to maintain synchronicity. With higher processor speeds (shorter clock cycles), the relative effect of skew increases.

One way to maintain synchronicity uses a phase locked loop (PLL) that has an internal clock in the form of a voltage controlled oscillator (VCO). A PLL receives an input signal (e.g., a reference clock signal that embodies the system clock period (T)), synchronizes the PLL's internal clock with the input signal's phase and frequency, and delivers an output clock signal equal to a multiple of the input signal. The PLL may accomplish this synchronicity by controlling a voltage bias to the VCO including a delay line.

As shown in FIG. 1, a delay line 10 may include differential current starved delay stages 12a–k, where k is a number that is large enough to guarantee that the delay through the delay line 10 can be adjusted to a percentage of T, e.g., 2T and T/5, in spite of the effects of any manufacturing process variations, operating temperatures, supply conditions, and range of operating clock periods. The desired time delay may be adjusted to a multiple of T in a number of ways, e.g., by changing the value of k, by dynamically adjusting the current/voltage driving the delay line 10 during circuit operation as described below, or by manufacturing calibration or trim techniques. These adjustment techniques all require using large-range control structures to cover large variability in necessary delay time.

A current digital-to-analog-converter (IDAC) 14 may drive the current/voltage used by the delay stages 12a–k at a node 18. The current/voltage on the control line 18 is inversely proportional to T and to the time delay across each delay stage 12a–k. The IDAC 14 can provide many coarse current steps so that the delay line 10 can be adjusted to the desired delay value as described above. The IDAC 14 also can provide many fine current steps to compensate for the linear relationship between digital inputs 16a–n and the current/voltage at the node 18.

FIG. 2 shows another IDAC 11. The IDAC 11 includes m digital inputs 13, each digital input corresponding to a transistor 15a–m and a switch 17a–m.

DESCRIPTION

Figure 1:
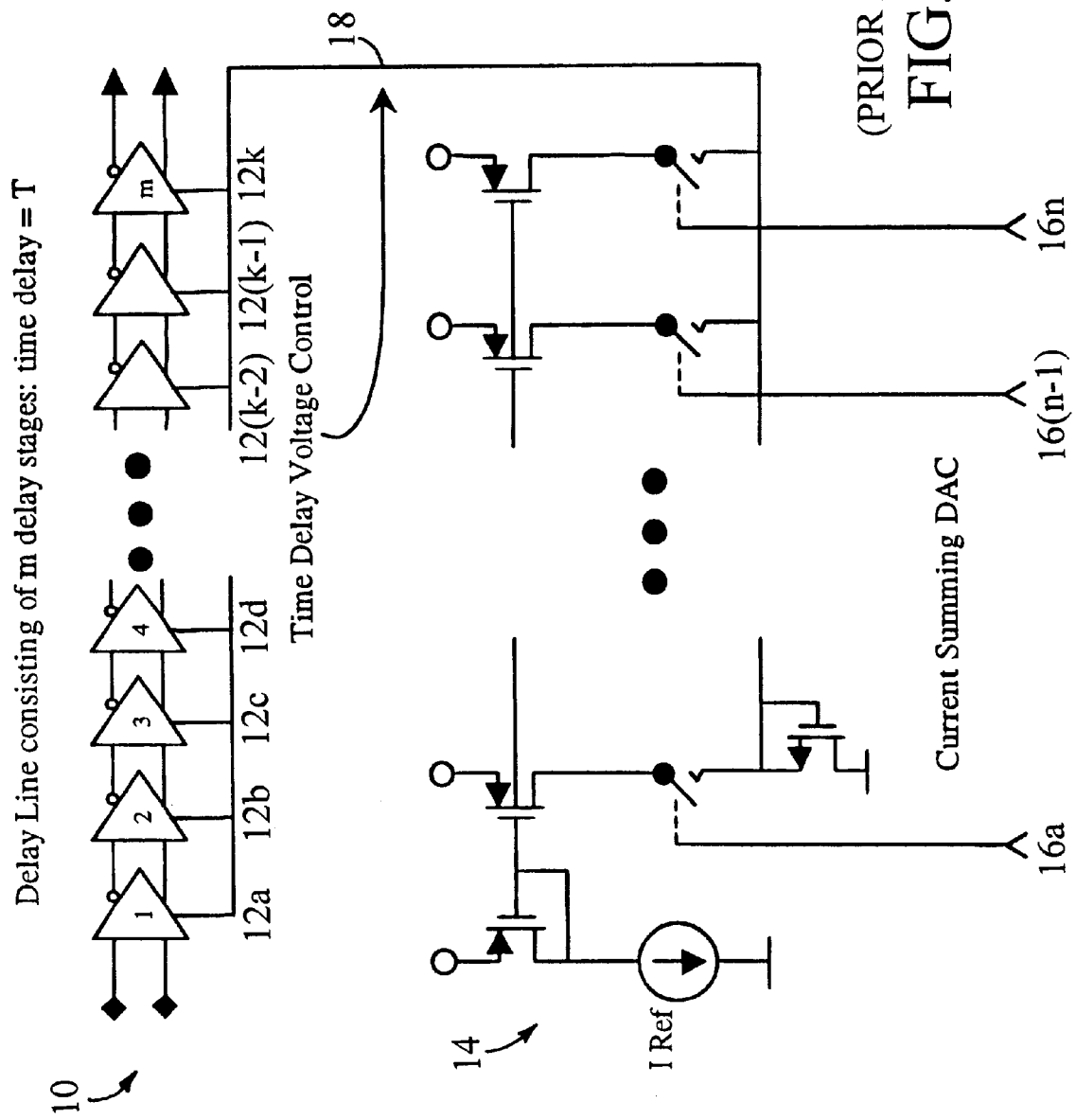
FIG. 1 is a diagram of a prior art delay line.
Figure 2:
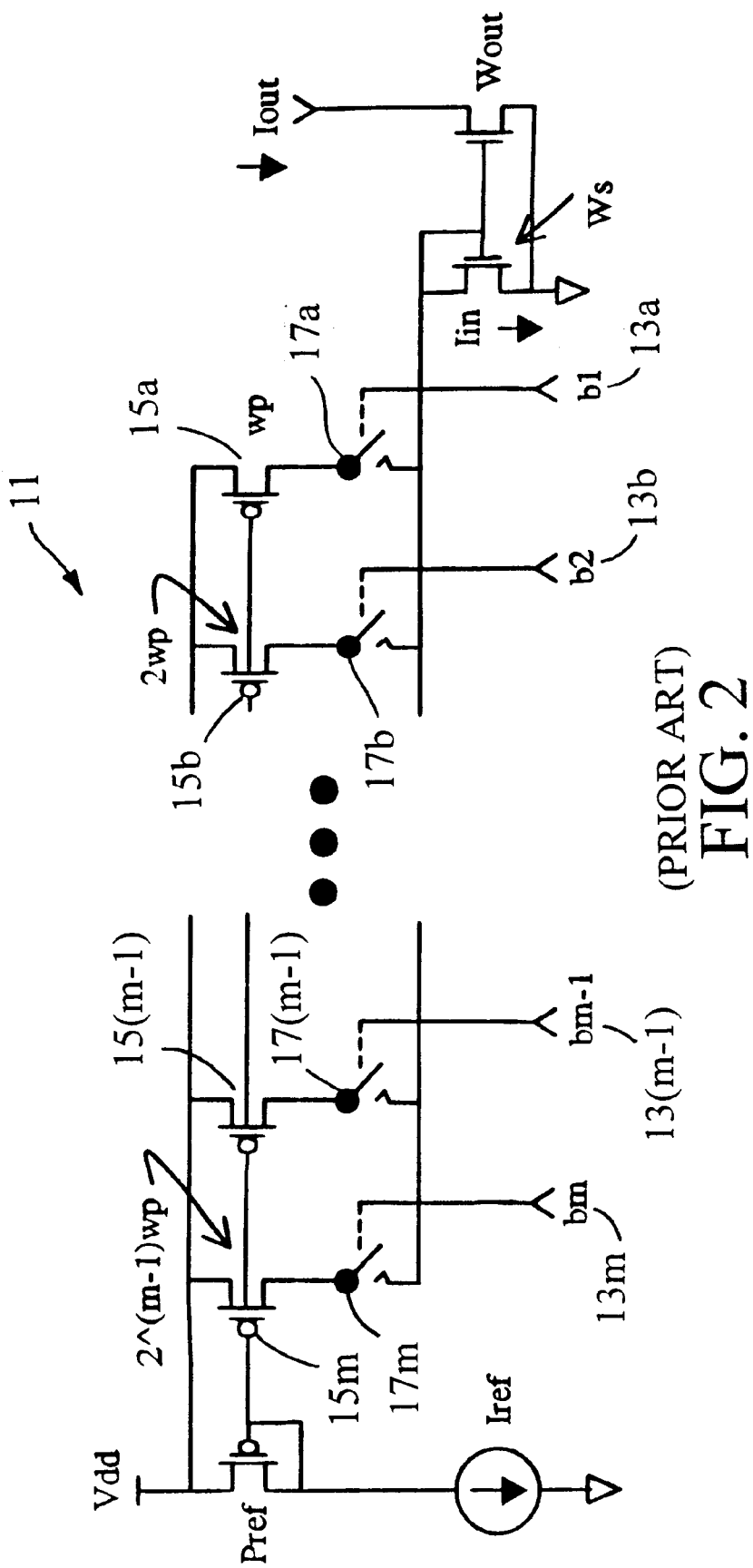
FIG. 2 is a diagram of a prior art digital to analog converter.
Figure 3:
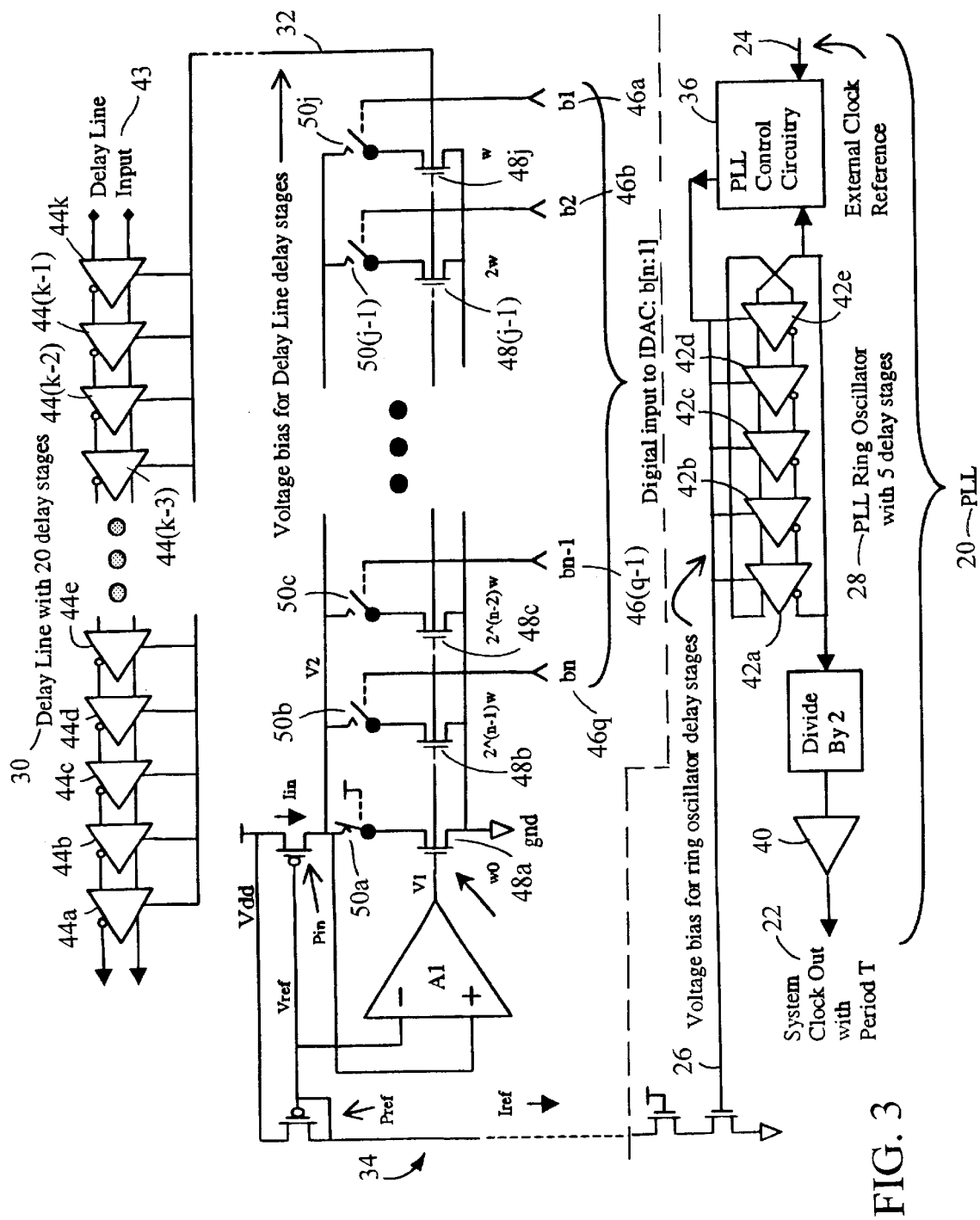
FIG. 3 is a diagram of a digital delay line according to an embodiment of the invention.

In one embodiment shown in FIG. 3, a PLL 20 phase and frequency locks the system clock output signal 22 to a reference clock input signal 24 by controlling the voltage bias to a voltage controlled oscillator (VCO) 28 at a VCO control node 26. The same, a replication of, or a scaled copy of the voltage bias that controls the VCO 28 at the VCO control node 26 controls the delay through a digital delay line 30 at a delay line control node 32. An IDAC 34 delivers the voltage bias to the delay line control node 32. Using the IDAC 34 in this way allows the time delay on the delay line 30 to automatically adjust to and continuously track the operation of the PLL 20. In this way, a delay line input 43 may be delayed through the delay line 30 at a percentage of T. Additionally, the delay line 30 can include a relatively small number of, e.g., only ten delay stages 44a–k (twenty delay stages 44a–k are shown in FIG. 2) with a total nominal delay of the system clock period (T) and still reliably track the operation of the PLL 20. The delay is first order insensitive to manufacturing process variations, operating temperatures, supply conditions, aging effects, temperature drift, and range of operating clock periods since the PLL 20 controls it.

The IDAC 34 also provides for fine delay adjustments to the delay line 30 via digital inputs 46a–q. The digital inputs 46a–q are used to fine-tune the delay through the delay line 30 to compensate for second order effects. Second order effects may include device mismatch of the PLL 20 to the delay stages 44a–k and/or errors in scaling the voltage bias used to control the delay.

The digital inputs 46a–q can also be used to adjust the delay line 30 for use in a digital locked loop (DLL). The IDAC 34 may also be used in non-PLL and non-DLL system and applications as described further below. A DLL controls the phase of internal clock signals with respect to external clock signals, as opposed to a PLL, which controls the output phase and frequency of its internal clock signals with respect to an external clock signal. By properly controlling Wnin, the channel widths of all n-channel transistors 48a–j included in the IDAC 34 and enabled through switches 50a–j, the range of delays and the step change of delay relative to the nominal delay can be chosen as a percentage of T. Wnin is defined as:

$$Wnin = W0 + \sum_{i=1}^{n} bi \times 2^{i-1} \times w,$$

where w is a unit size width and bi equals the binary value zero or one at the digital inputs 48a–j. This range and step change also tracks the system clock in this embodiment.

The IDAC 34 also provides a linear relationship between the binary value of the digital inputs 46a–q and the delay of the delay line 30 when constant voltage swing delay stages 44a–k are used, i.e., voltage swing is not a function of the operating frequency. The inverse relationship between the current sourced to the delay stages 44a–k and the digital inputs 46a–q provides this linear relationship.

Still referring to FIG. 3, in an example of a 1× clock multiplication, the PLL 20 receives a 60 Hz reference clock input signal 24 and phase locks the system clock output signal 22 to the reference clock input signal 24. The input signal 24, equal to the reference clock frequency of 60 Hz (reference clock period (T) of 1/60 Hz), enters the PLL 20 through control circuitry 36. The control circuitry 36 drives the VCO 28 with a 60 Hz signal.

Figure 4:
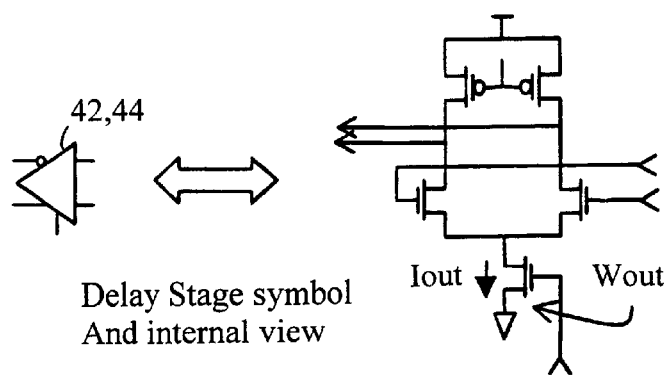
FIG. 4 is diagram of a delay stage.

The VCO 28 includes an odd number (R, here R equals five) of differential current starved PLL delay stages 42a–e identical to the delay stages 44a–k used in the delay line 30. FIG. 4 shows the internal structure of each delay stage 42a–e, 44a–k, though alternate structures may be used, e.g., non-differential current starved delay stages. The delay (td) across each delay stage 42a–e equals:

$$td = \frac{T}{2nR},$$

where n is a frequency multiplication factor equal to the system clock frequency divided by the reference clock frequency (here n equals one). The total delay through all of the PLL delay stages 42a–e equals T/2n. The PLL 20 feedback indirectly and continuously causes the control current/voltage used by all of the PLL delay stages 42a–e to have the value necessary to cause the system clock period to equal T. The desired control current/voltage value is inversely proportional to T and to the delay across each PLL delay stage 42a–e. The value of the system clock output signal 22 is phase and frequency locked to the input signal 24. The clock generation circuit in this example is a voltage controlled ring oscillator, but other clock generation circuits may be used to generate the PLL's internal clock.

Figure 5:
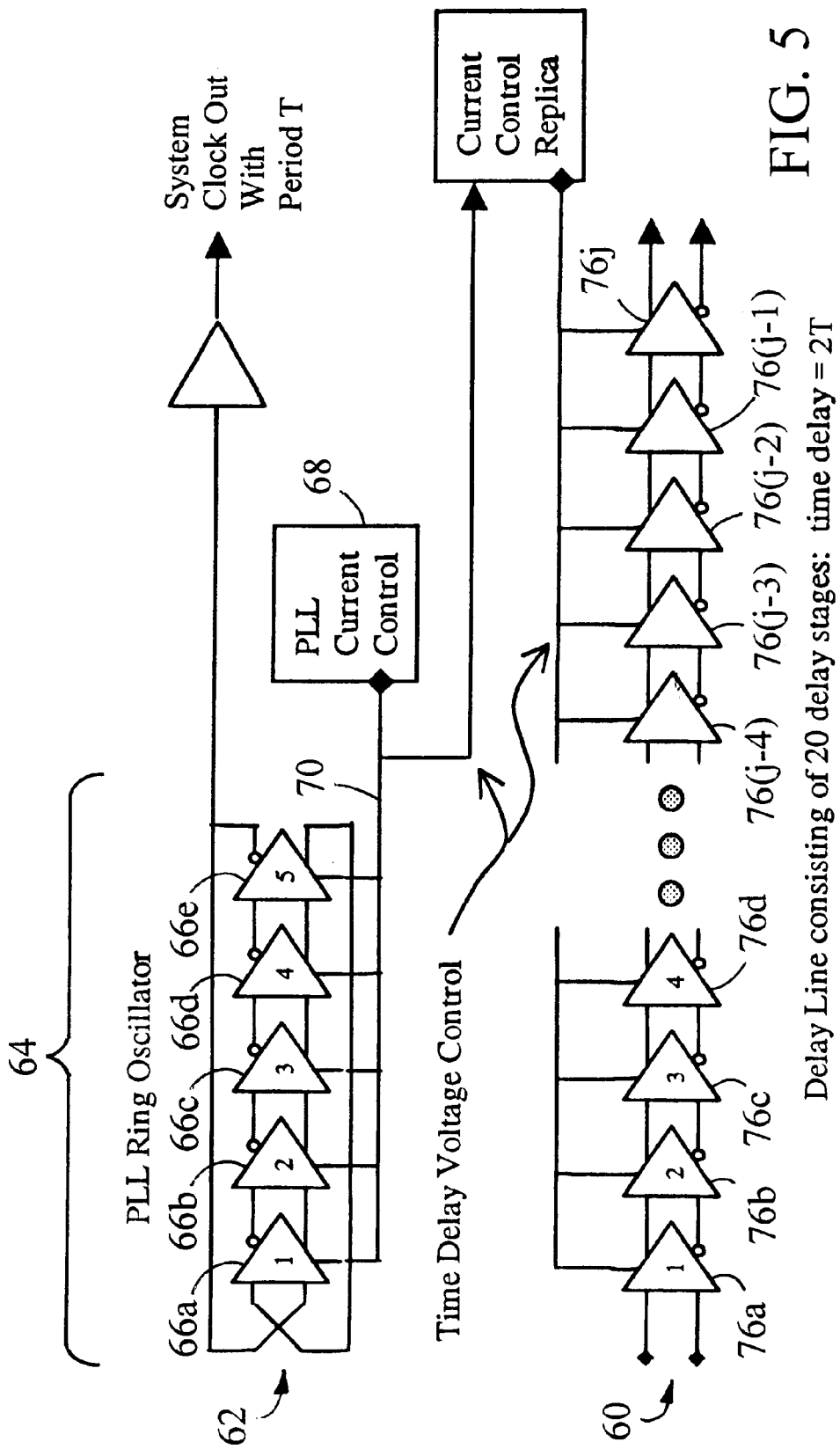
FIG. 5 is a diagram of a digital delay line according to an embodiment of the invention.

In another embodiment shown in FIG. 5, the delay through a delay line 60 can automatically and continuously track the system clock period (T) generated by a PLL 62. The delay line 60 can also eliminate the need for calibration and reduce process/voltage/supply sensitivity. The PLL includes a voltage controlled ring oscillator (VCO) 64 having R (here R equals five) PLL delay stages 66a–e. Each PLL delay stage in 66a–e functions as described above and has an internal structure as shown in FIG. 4, though alternate structures may be used. PLL current control circuitry 68 provides the voltage bias that controls the VCO 64 at a PLL node 70. Current control replica circuitry 72 replicates the PLL current control 68 and provides the voltage bias that controls delay stages 76a–j in the delay line 62 at a delay line node 74. There are an integer or rational fraction number of the delay stages 76a–j, which are identical to the PLL delay stages 66a–e. Because of this configuration, the delay line 60 can track T as generated by the PLL 62.

The delay through the delay line 60 is first order insensitive to manufacturing process variations, operating temperatures, supply conditions, aging effects, temperature, and drift. Trim, calibration, and additional manufacturing control of the device characteristics, e.g., resistor sheet resistivity, of the delay line 60 are not required.

However, due to potential circuit mismatch (second order effects) between the PLL 62 (specifically the VCO 64) and the delay line 60 and between the PLL current control 68 and the current control replica 72, an error elimination scheme may be necessary. This scheme can include a digital narrow range control. A narrow range control affords either very high resolution or reduction in digital logic due to associated narrow width registers. The narrow range control may be controlled by a local DLL that strives to make the delay through the delay line 60 equal to a percentage of T. The control mechanism for the DLL usually is a digital control register. The embodiment in FIG. 5 affords high control resolution and the use of a narrow control register because of narrow second order effects.

The delay line 60 and PLL 62 in FIG. 5 may also be used as the delay line 30 and PLL 20 in FIG. 3, with an IDAC as described above regarding FIG. 3 (or below regarding FIG. 6) acting as the current control replica 72.

Figure 6:
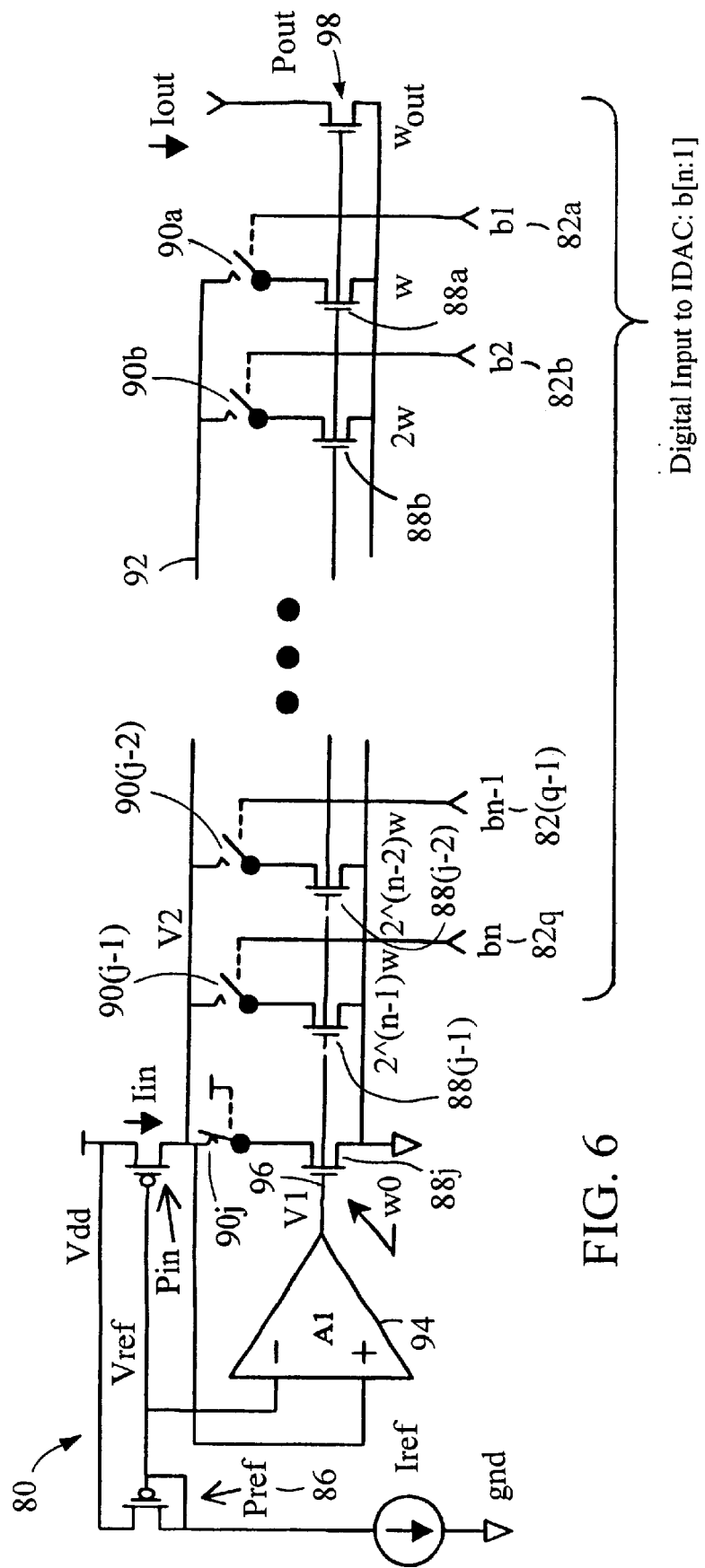
FIG. 6 is a diagram of a digital-to-analog converter according to an embodiment of the invention.

In another embodiment shown in FIG. 6, an IDAC 80 provides an inverse relationship between the binary value of digital inputs 82a–q and the value of an output current Iout. Digital selection of amplifier gain elements using the digital inputs 82a–q controls the value of Iout. The IDAC 80 could be used to control any kind of delay line. The IDAC 80 can scale a delay line value relative to a reference voltage, current, or PLL operating frequency. The IDAC 80 also allows the introduction of a deliberate delay skew.

A reference current source Iref establishes Iout and Iin. The mathematical relationship between Iin and Iref is:

$$Iin = Iref \times \frac{Wpin}{Wpref}$$

Wpin and Wpref are the channel widths of p-channel transistors Pin 84 and Pref 86, respectively. The channel lengths of Pin 84 and Pref 86 are equal. Pin 84 and Pref 86 operate in saturation mode.

Iin is divided among all n-channel transistors 88a–j, which are enabled when their respective series switches 90a–j are closed. For all digital inputs 82a–q at a logic one, the switches 90a–(j−1) that they control will be closed. For all digital inputs 82a–q at a logic zero, their corresponding switches 90a–(j−1) will be open. In other embodiments of the IDAC 80, the logic states could trigger the opposite switch positions. The digital input vector b[n:1] is used to select the various n-channel transistors 88a–(j−1) via the switches 90a–(j−1), possibly with a binary selection scheme.

All transistors in the IDAC 80, including Pin 84 and the n-channel transistors 88a–j, constitute an amplification stage having an amplification factor A2 and an output voltage V2 at a V2 node 92. V2 is given by:

$$V2 = \frac{Vref}{\left(1 + \frac{1}{A1 \times A2}\right)}$$

A1 is the amplification factor for a differential amplifier stage 94. The differential amplifier stage 94 provides an output voltage V1 at a V1 node 96, expressed as:

$$V1 = A1 \times (V2 - Vref)$$

For large A1×A2, V2 approximates Vref and Iin approximates Iref when Wpref equals Wpin.

Iin remains a constant. Wnin (defined above), however, varies according to the binary value of b[n:1], and A2 varies, causing the voltage at the V1 node 96 to vary. These variations cause a new distribution of Iin among the n-channel transistors 88a–j. In this way, the IDAC 80 provides a digital to voltage gain at the V1 node 96.

In this way, Iref also establishes Iout. The mathematical relationship between Iout and Iref is:

$$Iout = Iref \times \frac{Wpin}{Wpref} \times \frac{Wout}{Wnin}$$

Wout is the channel width of p-channel transistor Pout 98. The channel length of all the n-channel transistors 88a–j and Pout 98 are equal.

The voltage at the V1 node 96 may act as the bias control of current starved delay stages. When so used, the IDAC 80 functions as a digital to delay converter with the delay of the delay stages linearly proportional to the binary value of the digital inputs 82a–j. Current starved delay stages that have constant voltage swing over a range of operating frequencies have the following relationship between their output delay and their operating current:

$$td = \frac{CV}{I}$$

In this equation, td is the time delay, C is the capacitive loading on each delay stage, V is the output voltage swing of the delay stage, and I is the value of the constant current source supplying each delay stage. If I equals Iout, then:

$$td = \frac{Wnin}{Wout} \times \frac{Wpref}{Wpin} \times \frac{CV}{Iref}$$

This implies that td is proportional and linearly related to Wnin and the binary value of b[n:1].

The delay of a delay line can be further adjusted linearly by the digital inputs 82a–j to the IDAC 80. Additionally, the IDAC 80 requires no coarse current adjustment steps and far less adjustment range.

Figure 7:
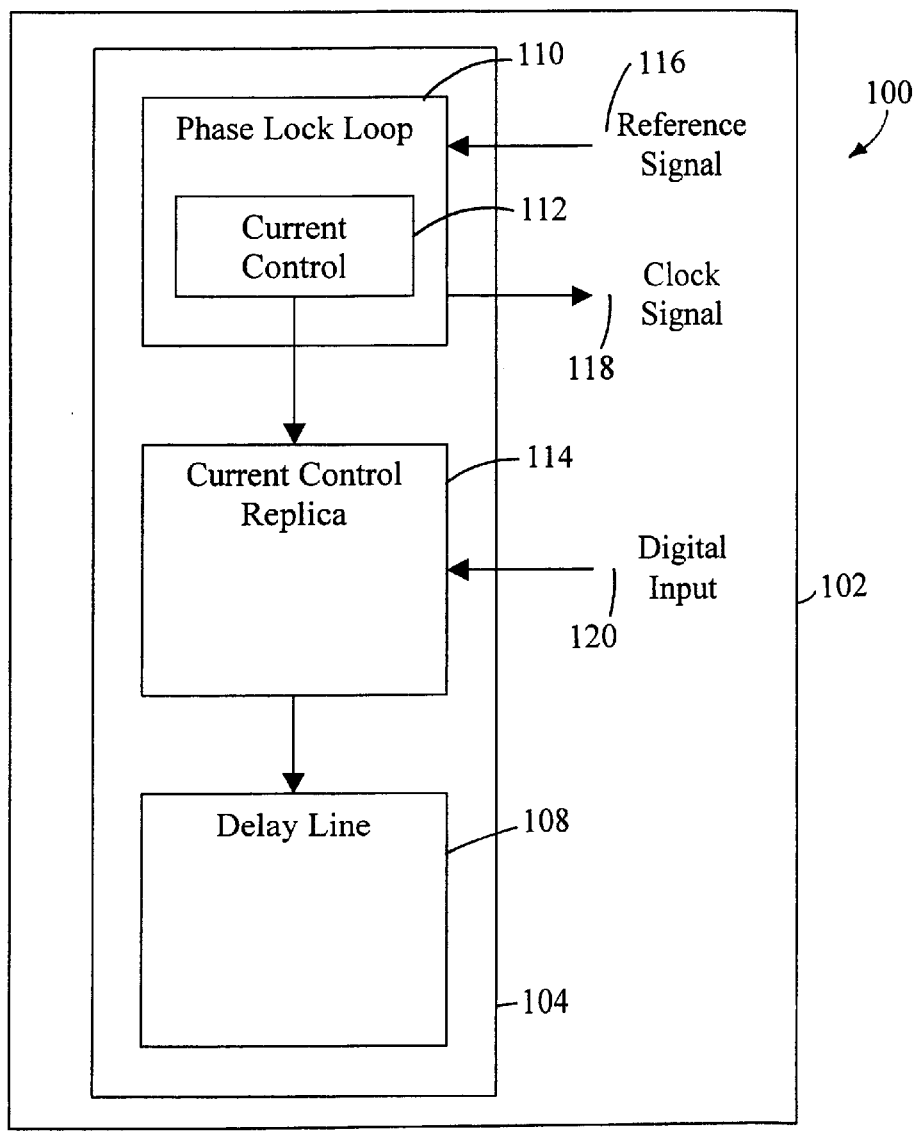
FIG. 7 is a diagram of a system embodying the invention.

Referring to FIG. 7, a system 100 includes a circuit board 102, e.g., a motherboard, including a time delay control chip 104 on the circuit board 102. The time delay control chip 104 includes a delay line 108, a PLL 110 having a current control 112, and a replica 114 of the current control 112. The PLL 110 is configured to receive an input reference clock signal 116 and output a system clock signal 118. The current control 112 is configured to output a signal used in generating the system clock signal 118 and to the current control replica 114. The current control replica 114 is configured to output a replica of this signal to the delay line 108. Digital input 120 to the current control replica 114 can be used to adjust the signal sent to the delay line 108. Using a replica of the current used by the PLL 110 enables the delay across the delay line 108 to equal a percentage of the system clock signal period and to track the delay over process, temperature, supply, and operating frequency.

Other embodiments are within the scope of the following claims.

What is claimed is:

1. An apparatus, comprising:
   a delay line; and
   a digital to analog converter configured to provide a signal to the delay line and to include a plurality of digital inputs configured to control the delay through the delay line by controlling amplifier gain elements included in the digital to analog converter.

2. The apparatus of claim 1 in which the digital to analog converter scales the delay through the delay line relative to an output voltage of the digital to analog converter.

3. The apparatus of claim 1 in which the digital to analog converter scales the delay through the delay line relative to an output current of the digital to analog converter.

4. The apparatus of claim 1 in which the digital to analog converter scales the delay through the delay line relative to an operating frequency of a phase locked loop.

5. A system comprising:
   a circuit board;
   a time delay control chip on the circuit board including a delay line and a digital to analog converter configured to provide a signal to the delay line and to include a plurality of digital inputs configured to control the delay through the delay line by controlling amplifier gain elements included in the digital to analog converter.

6. The system of claim 5 in which the digital to analog converter scales the delay through the delay line relative to an output voltage of the digital to analog converter.

7. The system of claim 5 in which the digital to analog converter scales the delay through the delay line relative to an output current of the digital to analog converter.

8. The system of claim 5 in which the digital to analog converter scales the delay through the delay line relative to an operating frequency of a phase locked loop.

9. A method comprising:
   providing n digital inputs to a digital to analog converter; and
   controlling an output signal of the digital to analog converter by controlling amplifier gain elements included in the digital to analog converter using the n digital inputs.

10. The method of claim 9 further comprising providing the output signal to a delay line to control the delay through the delay line.

11. The method of claim 10 in which the digital to analog converter scales the delay through the delay line relative to an operating frequency of a phase locked loop.

12. An apparatus comprising:
   a delay line;
   a phase locked loop having a current control; and
   a replica of the current control configured to receive at a node shared with the current control a first signal from the current control and to send a second signal to the delay line.

13. The apparatus of claim 12 in which the replica comprises a digital-to-analog converter.

14. The apparatus of claim 13 in which the digital-to-analog converter includes digital input.

15. The apparatus of claim 12 in which the phase locked loop and the delay line include substantially identical delay stages.

16. The apparatus of claim 15 in which the delay stages comprise current starved delay stages.

17. The apparatus of claim 12 in which the delay line comprises a fixed number of delay stages.

18. The apparatus of claim 12 in which the time delay on the delay line equals a percentage of an output signal of the phase locked loop.

19. A method comprising:
   controlling a phase locked loop using a voltage bias;
   replicating the voltage bias; and
   controlling a delay line using the replicated voltage bias.

20. The method of claim 19 in which the phase locked loop and the delay line include substantially identical delay stages.

21. The method of claim 20 in which the delay stages comprise current starved delay stages.

22. The method of claim 19 in which the delay line comprises a fixed number of delay stages.

23. The method of claim 19 in which the time delay on the delay line equals a percentage of an output signal of the phase locked loop.

* * * * *